United States Patent
Mintova Lazarova et al.

(10) Patent No.: US 10,647,584 B2
(45) Date of Patent: May 12, 2020

(54) METHOD FOR THE PREPARATION OF DEFECT-FREE NANOSIZED SYNTHETIC ZEOLITE MATERIALS

(71) Applicants: CENTRE NATIONAL DE LA RECHERCHE SCIENTIFIQUE, Paris (FR); ÉCOLE NATIONALE SUPÉRIEURE D'INGÉNIEURS DE CAEN, Caen (FR); UNIVERSITÉ DE CAEN / UNIVERSITÉ DE BASSE-NORMANDIE, Caen (FR)

(72) Inventors: Svetlana Mintova Lazarova, Basly (FR); Siddulu Naidu Talapaneni, Andhra Pradesh (IN); Julien Grand, Biéville-Beuville (FR); Jean-Pierre Gilson, Cairon (FR)

(73) Assignees: CENTRE NATIONAL DE LA RECHERCHE SCIENTIFIQUE, Paris (FR); ÉCOLE NATIONALE SUPÉRIEURE D'INGÉNIEURS DE CAEN, Caen (FR); UNIVERSITÉ DE CAEN / UNIVERSITÉ DE BASSE-NORMANDIE, Caen (FR)

( * ) Notice: Subject to any disclaimer, the term of this patent is extended or adjusted under 35 U.S.C. 154(b) by 182 days.

(21) Appl. No.: 15/770,313

(22) PCT Filed: Oct. 22, 2015

(86) PCT No.: PCT/IB2015/002243
§ 371 (c)(1),
(2) Date: Apr. 23, 2018

(87) PCT Pub. No.: WO2017/068387
PCT Pub. Date: Apr. 27, 2017

(65) Prior Publication Data
US 2018/0334389 A1    Nov. 22, 2018

(51) Int. Cl.
| | | |
|---|---|---|
| *C01B 37/00* | (2006.01) | |
| *C01B 39/08* | (2006.01) | |
| *B01J 29/89* | (2006.01) | |
| *C01B 37/02* | (2006.01) | |
| *B01J 29/48* | (2006.01) | |
| *B01J 29/70* | (2006.01) | |
| *B01J 20/28* | (2006.01) | |
| *B01J 29/40* | (2006.01) | |
| *B01D 53/02* | (2006.01) | |
| *B01J 20/10* | (2006.01) | |
| *B01J 20/30* | (2006.01) | |
| *C30B 7/10* | (2006.01) | |
| *C30B 29/34* | (2006.01) | |
| *C01B 39/36* | (2006.01) | |
| *C01B 39/40* | (2006.01) | |

(52) U.S. Cl.
CPC ............ *C01B 37/005* (2013.01); *B01D 53/02* (2013.01); *B01J 20/10* (2013.01); *B01J 20/28007* (2013.01); *B01J 20/28095* (2013.01); *B01J 20/3057* (2013.01); *B01J 20/3078* (2013.01); *B01J 20/3085* (2013.01); *B01J 29/405* (2013.01); *B01J 29/48* (2013.01); *B01J 29/7007* (2013.01); *B01J 29/7057* (2013.01); *B01J 29/89* (2013.01); *C01B 37/02* (2013.01); *C30B 7/10* (2013.01); *C30B 29/34* (2013.01); *B01D 2253/1085* (2013.01); *C01B 39/08* (2013.01); *C01B 39/365* (2013.01); *C01B 39/40* (2013.01)

(58) Field of Classification Search
CPC ..... C01B 37/005; C01B 39/08; C01B 39/365; C01B 39/40; B01J 20/10; B01J 20/28095; B01J 29/405; B01J 29/48; B01J 29/7007; B01J 29/7057; B01J 29/89
See application file for complete search history.

(56) References Cited

U.S. PATENT DOCUMENTS

| | | | | |
|---|---|---|---|---|
| 9,108,190 B1 * | 8/2015 | Fan | .................... | B01J 29/89 |
| 9,932,240 B2 * | 4/2018 | Hedlund | ................. | C01B 37/02 |
| 2014/0364631 A1 * | 12/2014 | Davis | .................. | C07D 493/08 |
| | | | | 549/463 |

OTHER PUBLICATIONS

Garcia Vargas, N., et al., "Synthesis and characterization of tin(IV) MFI: Sodium inhibits the synthesis of phase pure materials," Microporous and Mesoporous Materials 2012;152:37-49.
Ko, Y. S., et al., "Synthesis and Characterization of Zirconium Silicalite-1," Korean J. Chem. Eng. 1998;15(4):423-428.
Lew, C. M., et al., "Tin-containing zeolite for the isomerization of cellulosic sugars," Microporous and Mesoporous Materials 2012;153:55-58.
Osmundsen, C. M., et al., "Tin-containing silicates: structure-activity relations," Proc. R. Soc. A 2012;468:2000-2016.
Mal, N. K., et al., "Synthesis of Al-free Sn-containing molecular sieves of MFI, MEL and MTW types and their catalytic activity in oxidation reactions," Studies in Surface Science and Catalysis 1995;94(1):317-324.
International Search Report and Written Opinion for PCT Patent App. No. PCT/IB2015/002243 (dated May 4, 2016).

* cited by examiner

*Primary Examiner* — David M Brunsman
(74) *Attorney, Agent, or Firm* — Kenealy Vaidya LLP

(57) ABSTRACT

Some embodiments are directed to a method for the preparation of defect-free nanosized synthetic zeolite materials, to the defect-free nanosized synthetic zeolite materials, to stable colloidal suspensions of the defect-free synthetic zeolite materials, and to the use of the defect-free nanosized synthetic zeolite materials and the stable colloidal suspensions in various applications.

19 Claims, 8 Drawing Sheets

A)

B)

METHOD FOR THE PREPARATION OF DEFECT-FREE NANOSIZED SYNTHETIC ZEOLITE MATERIALS

CROSS REFERENCE TO RELATED APPLICATIONS

This application is a national phase filing under 35 C.F.R. § 371 of and claims priority to International Application No. PCT/IB2015/002243, filed on Oct. 22, 2015, the content of which is hereby incorporated in its entirety by reference.

BACKGROUND

Some embodiments relate to a method for the preparation of defect-free nanosized synthetic zeolite materials, to the defect-free nanosized synthetic zeolite materials, to stable colloidal suspensions of the defect-free synthetic zeolite materials, and to the use of the defect-free nanosized synthetic zeolite materials and the stable colloidal suspensions in various applications.

Zeolites and zeolite-like materials include a broad range of porous crystalline solids. The structures of zeolite-type materials are essentially based on tetrahedral networks which encompass channels and cavities. According to ©2001 IUPAC [*Pure Appl. Chem.*, 2001, 73, 2, 381-394], microporous crystalline materials with an inorganic, three-dimensional host structure composed of fully linked, corner-sharing tetrahedra and the same host topology constitute a zeolite framework type. The number of established framework or structure types has increased progressively in the last 4 to 5 decades of highly active research in the field of zeolites. Currently, the number of established structure types is clearly in excess of 229. All zeolite structure types are referenced with three capital letter codes. They have different framework densities, chemical compositions, dimensional channel systems and thus, different properties.

Zeolites are generally characterized by their high specific surface areas, high micropore volume, and capacity to undergo cation exchange. Therefore, they can be used in various applications, for example as catalysts (heterogeneous catalysis), absorbents, ion-exchangers, and membranes, in many chemical and petrochemical processes (e.g. in oil refining, fine- and petro-chemistry).

Most of the described zeolites are aluminosilicate zeolites and basically include a three-dimensional framework of $SiO_4$ and $AlO_4$ tetrahedra. The electroneutrality of each tetrahedra containing aluminum is balanced by the inclusion in the crystal of a metallic cation, for example a sodium cation. The micropore spaces (channels and cavities) are occupied by water molecules prior to dehydration. Pure-silica zeolites (e.g. pure-silica zeolite BEA, pure-silica zeolite MFI and pure-silica zeolite MEL), which have only silicon and virtually no aluminum, were also extensively studied because of their high hydrophobic character which imparts improved zeolite catalytic stability in aqueous environments, and improved catalytic activity and selectivity in reactions where molecules of different polar character are involved.

In parallel, the synthesis of zeolites in the presence of other metallic elements such as Ti, Fe, Co, Cu, Sn, Zr, Nb is an important research area in molecular sieve science since the introduction of metallic elements with different oxidation states and electronegativity modifies inter-alia their acidic and ion-exchange properties. As an example, WO97/33830 A1 describes the preparation of zeolite Ti-beta without aluminum, in the presence of hydrofluoric acid (HF) and in the absence of seed, by hydrolyzing a mixture of tetraethyl orthosilicate, tetraethylammonium hydroxide, water and hydrogen peroxide ($H_2O_2$); adding tetraethyl orthotitanate to the resulting solution and pursuing hydrolysis; evaporating off the ethanol; adding HF to the resulting mixture; and heating in an autoclave at 140° C. during 11 days. Such zeolite preparation is long and the fluoride anions coming from harmful HF lead to crystallization of big crystals. In addition, traces of fluoride anions are still present in the final crystalline zeolite product. In addition to the above-mentioned heteroatoms, transition metal ions (e.g. W, Mo, V, Cr ions) loaded onto several zeolites (e.g. HZSM-5, HZSM-11, HZSM-8, H-beta, HMCM-41, HMCM-49, HMCM-22, HY and H-mordenite) have been widely studied as catalysts for selective methane conversion reaction into benzene (also called dehydroaromatization of methane or DHAM). These catalysts are generally prepared by impregnation of the zeolite in an aqueous solution containing a salt of the transition metal ion (e.g. ammonium metatungstate) in acidic medium. The transition metal ions species are mainly located on the zeolite external surface and some of them diffuse into the internal channels of the zeolite. However, they are not an integral part of the zeolite framework.

Over the past decade, renewed efforts were devoted to prepare zeolites with enhanced accessibility to their micropores, including post-synthesis modification, one-step hydrothermal crystallization in the presence of mesopore modifiers and synthesis of nanosized zeolite crystals with or without organic templates. The interest in the preparation of nanosized zeolites has gradually increased, but only 18 from the 229 structures known to date have so far been synthesized with nanosized dimensions and stabilized in colloidal suspensions. Indeed, the particle size reduction of zeolites to the nanometer scale leads to substantial changes in their properties such as increased external surface area and decreased diffusion path lengths (which can lead to pore blocking by coke formation). More particularly, the specific conditions employed to lead to nanosized zeolites change their intrinsic characteristics, impeding the full use of their potential. Thus, all nanosized zeolites invariably contain significant levels of framework and surface defects. By way of example, pure-silica nanosized zeolites such as nanosized Silicalite-1 (MFI-type structure) and nanosized Silicalite-2 (MEL-type structure) still exhibit hydrophilic properties related to water adsorption on defect sites. Indeed, zeolites nanocrystals are generally synthesized at high pH values in alkaline or $OH^-$ medium (i.e. in the presence of hydroxide ions) and in the presence of a structure directing agent (i.e. SDA). Under such conditions, a large number of silanol nests is formed and the silanol groups obtained condense at high temperature (e.g. during calcination) to form Si—O—Si bridges. However, condensation is generally not complete and calcined zeolites still contain framework defects. Framework defect sites are prone to retain coke precursors, resulting in lower catalytic activity and faster deactivation.

The synthesis of zeolites in fluoride media (i.e. in the presence of fluoride ions) was developed to prepare defect-free zeolites (i.e. zeolites without framework defects), which improves their hydrophobic character and thus their catalytic activity. As an example, Camblor et al. [*J. Mater. Chem.,* 1998, 8, 9, 2137-2145] described the preparation of zeolite beta by contacting a source of silicon (e.g. tetraethylorthosilicate), a SDA (e.g. tetraethylammonium hydroxide reagent TEAOH) and a source of aluminum (e.g. metal aluminum), and then adding, fluoride anions $F^-$ (coming from HF). However, the zeolite crystals harvested in fluoride media are considerably larger (e.g. 0.5-3 μm) than those synthesized in alkaline medium because of their lower nucleation rate. Moreover, the obtained crystallites are agglomerated. Thus, their applications in various fields are hampered by severe diffusion limitations. In addition, a fluoride medium (HF in particular) raises serious safety issues for a large-scale implementation.

In order to improve the synthesis of nanosized crystals in fluoride medium, Qin et al. [*Adv. Funct. Mater.*, 2014, 24, 257-264] described a seeded fluoride medium synthesis of nanosized zeolites ZSM-5 by contacting a source of silicon, a source of aluminum, fluoride anions $F^-$ (coming from ammonium fluoride reagent $NH_4F$), a SDA (e.g. tetra-n-propylammonium hydroxide reagent TPAOH); and adding silicalite-1 seeds. However, the crystal size is not optimized (e.g. nanocrystals of at least 150 nm) and silanol nests are still present.

Burel et al. [*Microporous and Mesoporous Materials*, 2013, 174, 90-99] recently reported the preparation of nanosized pure silica zeolite crystals by post-synthesis fluoride treatment. More particularly, nanosized silicalite-1 crystals were prepared according to the conventional hydroxide route and then treated with $NH_4F$ under relatively mild conditions. The density of framework connectivity defects is decreased. However, the zeolite hydrophobicity and the size of the zeolite crystals are still not optimized (e.g. nanocrystals of about 150 nm).

SUMMARY

Consequently, an alternative method of synthesis that provides high quality nanosized and defect-free zeolites without the above disadvantages is highly desirable, in particular for applications such as adsorption and heterogeneous phase catalysis.

Some embodiments provide a simple and economic preparation method which leads from commonly used initial reagents, to a defect-free synthetic zeolite material in the form of nanocrystals, which is highly hydrophobic and has excellent colloidal and thermal stabilities.

Some embodiments are directed to a method for the preparation of a defect-free synthetic zeolite material in the form of monodisperse single nanocrystals having a size ranging from about 10 to about 400 nm, preferably from about 10 to about 100 nm, and more preferably or advantageously from about 20 to about 80 nm, the defect-free synthetic zeolite material having a MFI-, BEA- or MEL-framework type and a silicon to metal M molar ratio Si/M ranging from about 179 to about 65440, the metal M being selected from W, V, Mo, Sn and Zr. The method can include the following steps:

1) contacting at least one source of silicon, at least one source of alkali metal M' selected from Na and K, at least one source of metal M selected from W, V, Mo, Sn and Zr, at least one tetraalkylammonium hydroxide structure-directing agent (TAAOH) and water, so as to obtain a clear aqueous suspension having the following molar composition:

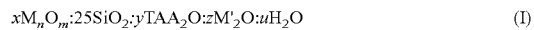

$$xM_nO_m:25SiO_2:yTAA_2O:zM'_2O:uH_2O \quad (I)$$

in which:
0.01≤x≤1.5, and preferably 0.25≤x≤1,
2≤y≤9, and preferably 3≤y≤7,
0.01≤z≤4, and preferably 0.5≤z≤3,
200≤u≤3000, and preferably 400≤u≤600, and more preferably about 500,
n is an integer equal to 1 or 2, and
m is an integer and 2≤m≤5;

2) aging the resulting clear suspension of step 1) at a temperature ranging from about 20° C. to about 30° C.;

3) heating the resulting clear suspension at a temperature ranging from about 40° C. to about 180° C., and preferably at a temperature ranging from about 50° C. to about 120° C., so as to form a dispersion of a solid including monodisperse single nanocrystals of the defect-free synthetic zeolite material in a liquid;

4) separating and recovering the solid from the liquid; and 5) calcining the solid so as to obtain the defect-free synthetic zeolite material in the form of monodisperse single nanocrystals.

Within the meaning of some embodiments, the term "clear aqueous suspension" is understood to mean an aqueous suspension having approximately the same refractive index as water, that is to say a refractive index of about 1.333±0.030.

Within the meaning of some embodiments, the term "monodisperse single nanocrystals" is understood to mean single nanocrystals having approximately the same size and shape.

Within the meaning of some embodiments, the term "single nanocrystals" is understood to mean individual nanocrystals or non-agglomerated nanocrystals. This also means that the synthetic zeolite material prepared according to the method of some embodiments includes at most about 5% by mass of aggregates of nanocrystals and/or polycrystalline agglomerates, preferably at most about 1% by mass of nanocrystals and/or polycrystalline agglomerates, and more preferably it is free from aggregates of nanocrystals and/or free from polycrystalline agglomerates.

Within the meaning of some embodiments, $TAA_2O$ is the product formed after step 1) and directly derived from the tetraalkylammonium hydroxide structure-directing agent (TAAOH) starting material. $TAA_2O$ is a bis(tetraalkylammonium) oxide compound.

The process of some embodiments allows the precise control of the nucleation stage [steps 1) and 2)] and of the crystallization step (step 3). Therefore, it leads to a defect-free synthetic zeolite material in the form of monodisperse single nanocrystals with a narrow particle size distribution and a higher crystalline yield compared to the methods of the related art (i.e. above 20% by mass). In addition, the defect-free synthetic zeolite material obtained by the process of some embodiments is totally free from framework defects (i.e. defect-free synthetic zeolite material) and therefore, displays high hydrophobicity. Indeed, the process of some embodiments allows an increase of the hydrophobicity as well as a decrease of the nanocrystal size, therefore leading to a defect-free synthetic zeolite material displaying excellent thermal and colloidal stabilities as well as a superior catalytic activity.

Within the meaning of some embodiments, the term "defect free single nanocrystals" is understood to mean nanocrystals free of silanol defects and "nest" type of defects, thus resulting in highly hydrophobic zeolite nanocrystals having approximately the same size and shape.

In the method of some embodiments, metals (W, V, Mo, Sn and Zr) are used as defect-suppressing elements due to their flexible coordination state and thus the defect sites (internal and external silanols) in the zeolite nanocrystals are saturated with M coordinated with 4 or 2 Si (T-atoms) via oxygen bridges, thus preventing the formation of silanols.

Moreover, the starting materials used in the synthesis are those commonly used in the commercial production of zeolites.

In addition, the process of some embodiments compared to conventional ones does not need fluoride-based agents as well as space confiners. Confined space synthesis method involves the crystallization of a zeolite inside of a matrix with controlled porosity. Thus, the crystals cannot grow larger than the pores of the used matrix. To date, a variety of space confiners such as carbon blacks, carbon nanotubes, starch, gelling polymers and polymer spheres have been utilized to confine the crystallization of zeolite nanocrystals.

Step 1):

The water is preferably de-ionized or double distilled water (dd $H_2O$). The distillation involves boiling the water and then condensing the vapor into a clean container to obtain primary condensed water, followed by boiling the primary condensed water and then condensing the new vaporized water into a collecting container.

The source of silicon can be selected from any source of silicon that is able to provide during step 1) monomeric or $Si_2$—$Si_6$ oxihydroxide species. Thus, the amount of larger $[SiOOH]_n$ units is limited in the clear aqueous suspension B [R. M. Barrer, "Hydrothermal Chemistry of Zeolites", 1982, Academic press, London].

In one embodiment, the source of silicon is selected from silica hydrogel, silicic acid, colloidal silica, fumed silica, tetraalkyl orthosilicates, silica hydroxides, precipitated silica and sodium silicates.

Tetraalkyl orthosilicates are preferred, and tetraethyl orthosilicate is more preferred.

The source of alkali metal M' is selected from a source of Na and a source of K.

The sources of metal M and metal M' are preferably provided by the same component which is therefore a source of M and M'.

Examples of a source of M and M' can be a sodium or a potassium salt of the metal M such as $Na_2WO_4.2H_2O$, $K_2WO_4$, $NaVO_3$, $KVO_3$, $Na_2MoO_4.2H_2O$, $K_2MoO_4$, $Na_2SnO_3.3H_2O$, $K_2SnO_3.3H_2O$, $Na_2ZrO_3$, $K_2ZrO_3$, and preferably $Na_2WO_4.2H_2O$ or $NaVO_3$.

The tetraalkylammonium hydroxide structure-directing agent is preferably tetraethylammonium hydroxide (TEAOH), tetrapropylammonium hydroxide (TPAOH), or tetrabutylammonium hydroxide (TBAOH).

Step 1) can be performed at a temperature ranging from about 0° C. to about 30° C., and preferably at a temperature ranging from about 10° C. to about 30° C.

It is noted that step 1) does not involve a source of aluminum.

The resulting clear aqueous suspension of molar composition (I) has preferably a pH ranging from about 12 to about 14.

The Si/M molar ratio in the clear aqueous suspension of molar composition (I) obtained in step 1) can range from about 16.6 to about 2500.

The Si/M' molar ratio in the clear aqueous suspension of molar composition (I) obtained in step 1) can range from about 8.3 to about 2500.

The M/M' molar ratio in the clear aqueous suspension of molar composition (I) obtained in step 1) can be equal to 1 or 2.

In one preferred embodiment, step 1) is performed according to the following sub-steps:

1-a) separately preparing a clear aqueous silicate suspension A including at least one source of silicon, at least one tetraalkylammonium hydroxide structure-directing agent (TAAOH) and water, and a clear aqueous suspension B including at least one source of alkali metal M' selected from Na and K, at least one source of metal M selected from W, V, Mo, Sn and Zr, and water, and 1-b) admixing the clear aqueous silicate suspension A and the clear aqueous suspension B until a clear aqueous suspension having the molar composition (I) as defined in some embodiments is obtained.

The clear aqueous silicate suspension A of sub-step 1-a) can be prepared by mixing at least one source of silicon, at least one tetraalkylammonium hydroxide structure-directing agent (TAAOH) and water, and stirring the resulting mixture at room temperature. Sub-step 1-a) thus allows the separate hydrolysis of the source of silicon in the presence of the TAAOH.

The water in sub-step 1-a) is preferably de-ionized or double distilled $H_2O$.

In one embodiment, the preparation of the clear aqueous silicate suspension A further includes the heating of the resulting mixture, more particularly if the source of silicon is colloidal silica.

The heating is preferably performed at a temperature ranging from 60° C. to 100° C. approximately, during 1 min to 10 min approximately.

Subs-step 1-a) leads to a clear aqueous silicate suspension A with amorphous particles having a defined size.

In one embodiment, the heating is conducted by putting the resulting mixture in an oven.

The clear aqueous suspension B of step 1-a) can be prepared by mixing at least one source of metal M selected from W, V, Mo, Sn and Zr, at least one source of alkali metal M selected from Na and K, and water, and stirring the resulting mixture at room temperature.

The water is preferably de-ionized or double distilled $H_2O$.

In one embodiment, the preparation of the clear aqueous suspension B further includes the heating of the resulting mixture.

In most cases, no heating is required and a complete dissolution at room temperature is achieved.

However, a high concentration of metal M in the clear aqueous suspension B can require heating to be dissolved.

The heating is preferably performed at a temperature ranging from 60° C. to 100° C. approximately, during 1 min to 10 min approximately.

In one embodiment, the heating is conducted by putting the resulting mixture in an oven.

In one embodiment, the admixing sub-step 1-b) is performed at a temperature ranging from 0° C. to 30° C. approximately, and preferably ranging from 20° C. to 30° C. approximately. These conditions help to better decrease the polymerization kinetics between silicon and metal M based-species and obtain highly uniform amorphous particles (in chemical composition and particle size) in the resulting clear aqueous suspension.

In an advantageous or preferred embodiment, the clear aqueous suspension B is added drop wise to the clear aqueous silicate suspension A, the clear aqueous silicate suspension A being eventually kept at a temperature ranging from 0° C. to 30° C., and more preferably ranging from 20° to 30° C.

The drop wise addition greatly improves the introduction (or incorporation) of the metal M in the framework of the defect-free synthetic zeolite material.

It is also advantageous or preferable to perform step 1-b) under vigorous mechanical stirring or sonication, preferably during about 10 minutes to about 1 h.

Thus, sub-step 1-b) leads to the homogeneous distribution of reactive silicon-based and metal M-based species in the resulting clear aqueous suspension of molar composition (I).

In the resulting clear aqueous suspension, the values of n and m in the metal oxide $M_nO_m$ depend on the nature of the metal M and its oxidation state in the suspension.

$M_nO_m$ can be chosen from $WO_3$, $MoO_3$, $SnO_2$, $VO_3$ and $ZrO_2$, and is preferably chosen from $WO_3$ or $VO_3$.

The resulting clear aqueous suspension of molar composition (I) obtained in sub-step 1-b) has preferably a pH ranging from about 12 to about 14.

Step 2)

The aging step 2) is preferably carried out by stirring the clear aqueous suspension of step 1), for example by magnetic stirring (e.g. with a magnetic stirrer), and/or by mechanical stirring, and/or by shaking and/or by orbital stirring (e.g. with an orbital shaker).

The aging step can last for at least 4 hours approximately and preferably for at least 24 hours approximately.

In an advantageous or preferred embodiment, the stirring is firstly carried out by magnetic stirring, mechanical stirring or shaking during 2 to 4 hours approximately and then, by orbital stirring or shaking during 6 to 24 hours approximately.

The aging step 2) is accomplished by maintaining the resulting clear aqueous suspension obtained in step 1) at a relatively low temperature, preferably below 30° C., and more preferably under conditions which will prevent dehydration of the reaction mixture (such as placing the resulting suspension in a sealed container and/or exposing it to a small amount of water vapor).

In one advantageous or preferred embodiment, the resulting clear aqueous suspension obtained in step 1) is maintained from about 21° C. to about 30° C. during step 2). This temperature should be maintained for a time sufficient to favor the nucleation. Thus, during the aging process each particle can generate a nucleus.

During the aging step 2), the clear aqueous suspension of step 1) remains clear and leads to the formation of a suspension composed of homogeneous amorphous particles.

Thanks to the homogeneous distribution of amorphous reactive silicon-based and metal M-based species in the resulting suspension during the aging step 2), the uniform nucleation in the system can be controlled.

Step 3):

Step 3) is a hydrothermal treatment and leads to the formation of the monodisperse single nanocrystals (i.e. crystallization step).

Indeed, during step 3), nuclei formed at the preceding step 2) grow to form uniform single nanocrystals with a size controllable by the physical parameters (i.e. conditions of hydrothermal heating).

Then, at the end of step 3), a solid (which includes monodisperse single nanocrystals of the defect-free synthetic zeolite material) is uniformly dispersed in a liquid (also called mother liquor).

If the crystallization temperature is too high, i.e. above 180° C., or if the crystallization temperature is too low, i.e. below 40° C., bigger crystals or low crystallinity is achieved, respectively.

Step 3) can be performed in static or rotating autoclave, and preferably in static autoclave.

As an example, step 3) performed at about 170° C. during 45 minutes in rotating autoclave affords 100 nm defect-free zeolite nanocrystals.

Step 3) is generally carried out in a 100 cm³ propylene bottle, preferably at autogenous pressure.

Step 3) is preferably performed at atmospheric pressure until the single nanocrystals of defect-free synthetic zeolite material are formed.

The crystallization time required to form single nanocrystals will typically range from about 6 to about 90 hours and more frequently from about 6 to 24 hours.

If the crystallization period is too long or too short, micro-sized crystals are obtained or low crystalline material is achieved.

Step 3) is preferably performed in the absence of seed crystals added prior to step 3).

Step 3) is generally performed without any agitation (i.e. without any mechanical stirring or any sonication).

It is noted that the formation in the preceding step 2) of amorphous nanoparticles of similar size and identical growth kinetics drastically limits the Ostwald ripening of the nanocrystals, therefore insuring ultimately a much narrower particle size distribution in the nanocrystals of the defect-free synthetic zeolite material obtained during step 3).

Step 4):

After step 3), the nanocrystals of the synthetic zeolite material are uniformly dispersed in mother liquor.

Thanks to the method of some embodiments, the monodisperse single nanocrystals are non-agglomerated.

The separation and recovering step 4) (i.e. purification and/or washing step) can be performed by filtration, by centrifugation, by dialysis or by using flocculating agents followed by filtration, so as to separate and recover the solid (which includes the defect-free synthetic zeolite material and the structure-directing agent) from the mother liquor.

The separation and recovering step 4) can be repeated several times in order to remove all material that is not converted into synthetic zeolite material.

Centrifugation (e.g. high-speed centrifugation) followed by several washes of the solid with hot double distilled water is preferred.

Washes are preferably repeated until the remaining water (from washes) has a pH ranging from about 7 to about 8.

The hot double distilled water is generally at a temperature of about 100° C.

Additives, such as flocculating agents, can be used in step 4) in order to facilitate the recovering of the synthetic zeolite material.

Examples of flocculating agents are polyethylene oxide flocculants, preferably the ones commercialized by Dow Chemicals under the brand name UCARFLOC Polymers such as UCARFLOC polymer 304® or UCARFLOC Polymer 309®, or polyacrylamides.

After step 4), the solid still contains the structure-directing agent.

Step 5)

Once the solid is separated and recovered from the mother liquor according to step 4), it is submitted to a calcination step 5) (i.e. heat treatment).

Step 5) can be carried out at a temperature ranging from 400° C. to 800° C. approximately, for example during 1 to 10 hours approximately, under an air, oxygen or inert ($N_2$) atmosphere.

The calcination step 5) aims at removing the tetraalkylammonium hydroxide structure-directing agent from the synthetic zeolite material.

It is noted that since the defect-free synthetic zeolite material is thermally stable, step 5) does not alter the structure and/or the framework of the defect-free synthetic zeolite material obtained in step 4).

Intermediate Steps

The method of some embodiments can further include between steps 4) and 5), a step i) of storing the solid obtained in step 4).

The storing step i) can be carried out either by drying the solid obtained in step 4) or preparing a colloidal suspension of the solid.

The drying step is preferably performed by lyophilization (i.e. freeze-drying step), preferably at a temperature ranging from about −76° C. to about −92° C. (i.e. freeze-drying step).

The drying step is advantageously conducted at atmospheric or sub-atmospheric pressures, notably for about 30 minutes to about 12 hours.

The freeze-drying step can prevent from irreversible agglomeration, for example if the calcination step 5) is not immediately performed after the step 4).

A colloidal suspension of the solid obtained in step 4) can be prepared by mixing the solid in an aqueous or organic suspension.

The organic suspension can include at least one organic solvent selected from alcoholic solvents and acetone.

Usual mass concentration of the solid (i.e. the nanosized zeolite crystals) in the organic suspension obtained in step i) is in the range of 1 to 5%, with respect of the total mass of the organic suspension.

Usual mass concentration of the solid (i.e. the nanosized zeolite crystals) in the aqueous suspension obtained in step i) is in the range of 1 to 10% by mass, with respect of the total mass of the aqueous suspension.

Further Steps

The method of some embodiments can further include after step 5), a step 6) of exchanging the alkali metal cations $M'^+$ of the defect-free synthetic zeolite material.

Step 6) is for example carried out if the defect-free synthetic zeolite material is intended to be used as a catalyst in acidic catalysis.

Typical treatment 6) is based on contacting the defect-free synthetic zeolite material with a solution containing a salt of ammonium cation. Thus, the alkali metal cation $M'^+$ is removed and replaced with ammonium.

After the ion-exchange step 6), the defect-free synthetic zeolite material can be calcined in air or inert gas according to a step 7).

Step 7) can be performed at temperatures ranging from about 380° C. to about 550° C., for periods of time ranging from about 1 to about 5 hours, to produce a defect-free synthetic zeolite material in acidic form. Thus, the alkali ammonium is removed and replaced with hydronium.

After step 7), the defect-free synthetic zeolite material can be directly used as a catalyst.

Indeed, the acidic form is required when the material is used as a catalyst in acid-catalyzed reactions such as most of the oil refining and petrochemical reactions.

It is noted that the acidic form is not required when the material is used as a catalyst in base-catalyzed reactions such as side chain alkylation reactions of aromatic hydrocarbons.

The method of some embodiments can further include after step 5), step 6) or step 7), a step 8) of storing the synthetic zeolite material.

The storing step 8) has the same definition as the one for the storing step i).

Indeed, thanks to the introduction of a metal M as defined in some embodiments in a high silica nanosized zeolite framework, surface silanols and intrinsic (framework) defects are removed by forming flexible M-O—Si bridges with moieties like M(=O) or M(=O)2. These newly created M-O—Si bonds are more stable than Si—O—Si bonds leading to improved stability of the zeolite nanocrystals in suspensions as well as thermal stability up to about 800-900° C. Moreover, the incorporation of the metal M in the zeolite material is highly homogeneous in all the crystal structure, and therefore offers important properties such as a well-defined structure (e.g. well-defined potential catalytic sites), hydrophobicity and Lewis acidity.

Some embodiments provide a defect-free synthetic zeolite material prepared according to the method as defined above, wherein:
- it is in the form of monodisperse single nanocrystals having a size ranging from about 10 to about 400 nm, preferably from about 10 to about 100 nm, and more preferably from about 20 to about 80 nm,
- it has a MFI-, BEA- or MEL-framework type, and
- it has a silicon to metal M molar ratio Si/M ranging from about 179 to about 65440, the metal M being selected from W, V, Mo, Sn and Zr.

In one embodiment, the defect-free synthetic zeolite material has a specific surface area $S_{BET}$ ranging from about 250 to 700 $m^2 \cdot g^{-1}$, and preferably from about 300 to 500 $m^2 \cdot g^{-1}$.

The defect-free synthetic zeolite material of some embodiments can have a total pore volume $V_{total}$ ranging from about 0.20 to 0.70 $cm^3 \cdot g^{-1}$, and preferably from about 0.40 to 0.60 $cm^3 \cdot g^{-1}$.

The defect-free synthetic zeolite material of some embodiments can have an external surface area $S_{ext}$ ranging from about 20 to 190 $m^2 \cdot g^{-1}$, and preferably from about 40 to 100 $m^2 \cdot g^{-1}$.

The defect-free synthetic zeolite material of some embodiments can include at most about 1% by mass of metal M, and preferably from about 0.1 to about 0.5% by mass of metal M, with respect to the total mass of the defect-free synthetic zeolite material.

It is noted that the defect-free synthetic zeolite material of some embodiments does not include aluminum. Thus, the silicon to aluminum molar ratio Si/Al is equal to ∞.

The defect-free synthetic zeolite material of some embodiments can have a silicon to alkali metal M' molar ratio Si/M' ranging from about 40 to about 8187.

The defect-free synthetic zeolite material of some embodiments can have a metal M to alkali metal M' molar ratio M/M' ranging from about 0.06 to about 0.45.

The synthetic zeolite material of some embodiments is defect-free which means that it does not contain any —OH groups (hydroxyl groups) and/or no water is released from the material. In other words, the defect-free synthetic zeolite material of some embodiments does not contain any silanol nests and/or any surface silanol groups.

Some embodiments provide a stable colloidal suspension of a defect-free synthetic zeolite material in the form of monodisperse single nanocrystals having a size ranging from about 10 to about 400 nm, preferably from about 10 to about 100 nm, and more preferably from about 20 to about 80 nm, the defect-free synthetic zeolite material having a MFI-, BEA- or MEL-framework type and a silicon to metal M molar ratio Si/M ranging from about 179 to about 65440, the metal M being selected from W, V, Mo, Sn and Zr, wherein it includes:
- at least one solvent, and
- a defect-free synthetic zeolite material as defined in some embodiments.

In one advantageous or preferred embodiment, the mass concentration of the defect-free synthetic zeolite material in the colloidal suspension ranges from about 0.1 to about 10% by mass, and preferably from about 0.1 to about 5% by mass, with respect of the total mass of the colloidal suspension.

Within the meaning of some embodiments, the term "stable colloidal suspension" is understood to mean: (a) a suspension without sedimentation of solid particles, (b) no change in particle size distribution in the suspension with time, and (c) a suspension with zeta potential value higher than 1401 mV.

In one embodiment, the solvent is selected from water, acetone, and alcohols such as methanol, ethanol or isopropanol.

The stable colloidal suspension can be obtained by:

A) preparing a defect-free synthetic zeolite material in the form of monodisperse single nanocrystals according to the method as defined in the first object of some embodiments; and B) dispersing the defect-free synthetic zeolite material in the form of monodisperse single nanocrystals of step A) in a solvent as defined above.

Some embodiments provide the use of a defect-free synthetic zeolite material in the form of monodisperse single nanocrystals as prepared according to the method as defined in some embodiments, as a catalyst or adsorbent in gas-solid and liquid-solid reactions (e.g. heterogeneous catalytic reactions), as seed crystals for zeolite synthesis, and for the preparation of membranes or layers (films).

Examples of heterogeneous catalytic reactions are metathesis reaction and epoxidation.

Some embodiments provide the use of a stable colloidal suspension of a defect-free synthetic zeolite material in the form of monodisperse single nanocrystals as defined in some embodiments, as a catalyst or adsorbent in gas-solid and liquid-solid reactions (e.g. heterogeneous catalytic reactions), as seed crystals for zeolite synthesis, and for the preparation of membranes or layers (films).

For example, the stable colloidal suspension can be used to provide a film having a thickness ranging from about 20 to about 1500 nm.

The obtained film is hydrophobic and can have different affinities with respect to gases. Therefore, it can be used as a selective gas sensing film.

Indeed, the defect-free synthetic zeolite material and the stable colloidal suspension of some embodiments can be used for medical, pharmaceutical and cosmetic purposes, environmental drug delivery, medical imaging, and other biomedical applications, as well as for chemical sensing and optical devices.

The defect-free synthetic zeolite material of some embodiments can be incorporated in matrices such as $SiO_2$, $Al_2O_3$, or amorphous silica-alumina matrices, so as to be shaped by known techniques such as spray drying, oil-drop, extrusion, pelletizing or tableting.

EXAMPLES

The starting materials used in the examples which follow, are listed below:
tetra-n-propylammonium hydroxide (TPAOH solution): 20% by mass in water solution, Alfa aesar;
tetraethyl orthosilicate (TEOS): 98%, Aldrich;
sodium tungstate dihydrate: 99%, Aldrich;
sodium metavanadate: 98%, Aldrich;
sodium zirconium oxide: 98%, Alfa Aesar;
sodium stannate trihydrate: 95%, Aldrich; and
sodium molybdate dihydrate: 98%, Alfa Aesar.

These starting materials were used as received from the manufacturers, without additional purification.

The various zeolites obtained in the examples were characterized over various scales of sizes.

Powder X-ray Diffraction (XRD) Analysis:

Powder samples of the zeolite materials obtained after step 4) or step 5) were measured using a PANalytical X'Pert Pro diffractometer with CuKα monochromatized radiation (λ=1.5418 Å, 45 kV, 40 mA). The samples were scanned in the range 3-70° 2θ with a step size of 0.016°.

Nuclear Magnetic Resonance (NMR) Analysis:

The crystallinity and defects of the zeolite materials obtained after step 4) or step 5) were determined by $^{29}Si$ and $\{^1H\}^{29}Si$ cross-polarization (CP) solid state MAS NMR on a Bruker Avance III-HD 500 (11.7 T) spectrometer operating at 99.3 MHz, using 4-mm outer diameter zirconia rotors spun at 12 kHz.

For $^{29}Si$ MAS NMR, a single pulse excitation (30° flip angle) was used with a recycle delay of 30 s.

For $\{^1H\}^{29}Si$ CP-MAS NMR, a contact time of 5 ms and a recycle delay of 2 s were used.

$^{29}Si$ chemical shift were referenced to tetramethylsilane (TMS).

The location of the structure-directing agent in the zeolite materials was determined by $^{13}C$ ($^1H$ decoupled, 75 kHz) NMR on a Bruker Avance III-HD 500 (11.7 T) spectrometer operating at 125.7 MHz, using 4-mm outer diameter zirconia rotors with a spinning frequency of 12 kHz.

Transmission IR Spectroscopy (FTIR) Analysis:

The presence of surface and bulk defects in the zeolite materials obtained after step 5) was evaluated on self-supporting pellets by transmission IR spectroscopy (Nicolet Magna 550-FT-IR spectrometer at 2 $cm^{-1}$ optical resolution).

Raman Spectroscopy Analysis:

In order to confirm the absence of metal oxides in the zeolite nanocrystals, the zeolite materials obtained after step 5) were analyzed with a Jobin Yvon Labram 300 spectrometer with a confocal microscope (laser: 532 nm, acquisition time: 240 s).

High-Resolution Transmission Electron Microscopy (HR-TEM):

Diluted colloidal suspensions of zeolite materials obtained after step 4) or step 5) were sonicated for 15 min and then 2-3 drops of fine particle suspensions were dried on carbon-film-covered 300-mesh copper electron microscope grids. The crystal size, morphology, crystallinity and chemical composition of solids were determined by high-resolution transmission electron microscopy (TEM) using a JEOL Model 2010 FEG system fitted with an EDX analyzer operating at 200 kV.

Scanning Electron Microscopy (SEM):

The surface features, morphology, homogeneity and size of zeolite nanocrystals obtained after step 5) were determined by field-emission scanning electron microscope using a MIRA-LMH (TESCAN) fitted with a field emission gun using an accelerating voltage of 30.0 kV. All samples prior the SEM characterization were covered with a conductive layer (Pt or Au).

Dynamic Light Scattering (DLS) Analysis:

The hydrodynamic diameters of the zeolite materials in the various suspensions were determined with a Malvern Zetasizer Nano dynamic light scattering (DLS). The analyses were performed on samples obtained after step 4) with a solid mass concentration of 1% and pH=8. The back scattering geometry (scattering angle 173°, HeNe laser with 3 mW output power at 632.8 nm wavelength) allows measurements at high sample concentration, since a complete penetration of the incident light through the sample is not required.

N$_2$ Sorption Analysis:

Nitrogen adsorption/desorption isotherms were measured using Micrometrics ASAP 2020 volumetric adsorption analyzer. Samples of the zeolite materials obtained after step 5) were degassed at 523 K under vacuum overnight prior to the measurement. The external surface area and micropore volume were estimated by alpha-plot method using Silica-1000 (22.1 m$^2$·g$^{-1}$ assumed) as a reference. The micropore and mesopore size distributions of solids were estimated by Nonlocal Density Functional Theory (NLDFT) and Barret-Joyner-Halenda (BJH) methods, respectively.

Chemical Analysis:

The chemical compositions of the zeolite materials obtained after step 5) were determined by inductively coupled plasma (ICP) optical emission spectroscopy using a Varian ICP-OES 720-ES and EDX-TEM.

Example 1

1.1 Preparation of a Defect-free MFI-type Synthetic Zeolite Material W-MFI-1 According to the Method of Some Embodiments Step 1):

A clear aqueous silicate suspension A was prepared by mixing 5.0 g of TEOS with 5.85 g of TPAOH solution. The clear aqueous silicate suspension A was stirring at room temperature (i.e. 25° C.).

A clear aqueous suspension B was prepared by mixing 0.45 g of sodium tungstate dihydrate in 3.95 g of dd H$_2$O.

Suspension B was added drop wise to the suspension A. During the addition, suspension A was maintained at room temperature while being vigorously stirred. The pH of the resulting clear aqueous suspension was about 12.

The resulting clear aqueous suspension had the following molar composition:

$$WO_3:25SiO_2:3TPA_2O:1Na_2O:500H_2O \quad (I).$$

Step 2):

The resulting clear aqueous suspension was then aged by magnetic stirring for 3 hours at room temperature and by orbital stirring for 14 hours at room temperature.

Step 3):

Then, the hydrothermal crystallization was conducted at 100° C. for 15 hours so as to obtain a solid including monodisperse single nanocrystals of defect-free synthetic zeolite material W-MFI-1, the solid being dispersed in mother liquor.

Step 4):

The solid was separated and recovered by high-speed centrifugation (20000 rpm, 10 min) and several washes with hot double distilled water (heated at 100° C. for 30 min) until the pH of the remaining water was about 7.5.

Step 5):

The solid was subjected to freeze-drying and calcined at 550° C. in air for 6 hours.

Monodisperse single nanocrystals of synthetic zeolite material W-MFI-1 with a Si/W molar ratio=647 and a Si/Na molar ratio=40 were obtained with a yield of about 25% by mass.

The monodisperse single nanocrystals had a size of about 70 nm.

1.2 Preparation of a MFI-type Synthetic Zeolite Material Si-MFI-A According to a Method which is not Part of Some Embodiments for Comparison A clear aqueous suspension was prepared by mixing 5.0 g of TEOS, 5.85 g of TPAOH solution and 3.95 g of dd H$_2$O. The clear aqueous suspension was stirring at room temperature (i.e. 25° C.).

The pH of the resulting clear suspension was about 12.

The resulting clear suspension had the following molar composition:

$$25SiO_2:3TPA_2O:500H_2O.$$

The resulting clear aqueous suspension was then aged by magnetic stirring for 3 hours at room temperature and by orbital stirring for 14 hours at room temperature.

Then, the hydrothermal crystallization was conducted at 100° C. for 15 hours to obtain a solid including monodisperse single nanocrystals of synthetic zeolite material Si-MFI-A, the solid being dispersed in mother liquor.

The solid was separated and recovered by high-speed centrifugation (20000 rpm, 10 min) and several washes with hot double distilled water (heated at 100° C. for 30 min) until the pH of the remaining water was about 7.5.

The solid was subjected to freeze-drying and calcined at 550° C. in air for 6 hours.

Monodisperse single nanocrystals of synthetic zeolite material Si-MFI-A were obtained with a yield of about 25% by mass.

Si-MFI-A zeolite material is not part of some embodiments since it does not include a metal M as defined in some embodiments.

The monodisperse single nanocrystals had a size of about 100 nm.

1.3 Preparation of a Defect-free MFI-type Synthetic Zeolite Material F-MFI-B According to a Method which is not Part of Some Embodiments for comparison A defect-free synthetic zeolite material F-MFI-B was prepared according to the method described in Guth et al. [*Stud. Surf. Sci. Catal.*, 1986, 28, 121].

The defect-free F-MFI-B synthetic zeolite material was obtained by hydrothermal crystallization at 60-200° C. in the presence of a structure-directing agent and in fluoride medium (instead of an alkaline medium).

A defect-free synthetic zeolite material F-MFI-B in the form of monodisperse single nanocrystals having a size of about 50 μm was obtained.

F-MFI-B zeolite material is not part of some embodiments since it does not include a metal M as defined in some embodiments.

1.4 Characterizations of W-MFI-1 and Si-MFI-A 1.4.1 Powder X-ray Diffraction (XRD), Raman and IR Analyses FIG. 1 represents the XRD diffraction spectrum of the defect-free synthetic zeolite material W-MFI-1 prepared according to example 1.1 [FIG. 1—grey line (b)] and for comparison of the synthetic zeolite material Si-MFI-A prepared according to example 1.2 [FIG. 1—black line (a)]. FIG. 1 shows the intensity (in arbitrary units: a.u.) as a function of the angle 2θ (in degree) in the range of 15-50 degrees [FIG. 1(A)], of 7.5-9.5 degrees [FIG. 1(B)] and in the range of 22.5-25 degrees [FIG. 1(C)].

Only Bragg peaks corresponding to MFI are present in both zeolite materials [cf. FIG. 1(A)]. In addition, the XRD patterns display distinct broad diffraction peaks, typical for nanosized MFI zeolite crystals. The peak positions vary significantly when W is introduced in the MFI type framework (W-MFI-1 zeolite material), i.e. they shift gradually to lower 2θ values [see FIGS. 1(B) and 1(C)].

FIG. 2 represents a Raman spectrum of the defect-free synthetic zeolite material W-MFI-1 prepared according to example 1.1 [FIG. 2—grey line (b)] and for comparison of the synthetic zeolite material Si-MFI-A prepared according to example 1.2 [FIG. 2—black line (a)]. FIG. 2 shows the absorbance (in arbitrary units: a.u.) as a function of the wavenumber (in $cm^{-1}$) in the range of 200-1500 $cm^{-1}$ [FIG. 2(A)] and in the range of 900-1400 $cm^{-1}$ [FIG. 2(B)].

FIG. 2 clearly indicates that no Raman signal corresponding to crystalline $WO_3$ (713 $cm^{-1}$ and 808 $cm^{-1}$) is detected, thus excluding the occurrence of a segregated $WO_3$ phase. W-MFI-1 zeolite material exhibits two new Raman bands (1036 $cm^{-1}$ and 1062 $cm^{-1}$) assigned to bending and symmetric stretching vibrations of framework O═W—O—Si, analogous to the M-O—Si vibration in the Ti-Silicate-1, Fe-Silicate-1, and Nb-Silicate-1 zeolites. The strong Raman band at 981 $cm^{-1}$ observed on Si-MFI-A zeolite material, does not appear on W-MFI-1 zeolite material [FIG. 2(B)]; the band is commonly assigned to the Si—OH stretching mode of $O_3Si$—OH groups, and thus related to the presence of defects in the MFI-type structure of Si-MFI-A zeolite material. The absence of this band in the W-MFI-1 zeolite material obviously implies the absence of framework defects.

FIG. 3 represents a FTIR spectrum of the defect-free synthetic zeolite material W-MFI-1 prepared according to example 1.1 [FIG. 3-(b)] and for comparison of the synthetic zeolite material Si-MFI-A prepared according to example 1.2 [FIG. 3-(a)].

The absence of the defective silanol groups in the W-MFI-1 zeolite material is confirmed by FIG. 3. Indeed, two intense bands at 3500 $cm^{-1}$ and 3734 $cm^{-1}$ are present on the Si-MFI-A zeolite material's spectra: the band at 3500 $cm^{-1}$ corresponds to silanol nests in the porous matrix, and the band at 3734 $cm^{-1}$ is attributed to both isolated external and internal silanol groups. They are absent on the IR spectrum of the W-MFI-1 zeolite material, suggesting that it is free from defects.

Hence, from the Raman and IR spectroscopic results, there is strong evidence that the W-MFI-1 nanosized zeolite material is defect-free.

1.4.2 NMR Analyses

The $^{29}Si$ NMR spectrum of the F-MFI-B zeolite material prepared according to example 1.3 [FIG. 4(A)-(c)] displays well resolved peaks between −108 ppm and −120 ppm, corresponding to the twelve nonequivalent framework silicon atoms [$Si(OSi)_4$, denoted as $Q_4$], in the orthorhombic structure; their chemical shifts are related to the average Si—O—Si bond angles. The $^{29}Si$ NMR spectrum of the Si-MFI-A zeolite material [FIG. 4(A)-(a)] consists of the $Q_4$ considerably less resolved than on the F-MFI-B zeolite material. An addition, a weak signal centered at −103 ppm is observed on Si-MFI-A zeolite material (6-7% of the total $^{29}Si$ signal), indicating the presence of many defective $Q_3$ sites such as terminal silanols, [$(HO)Si(OSi)_3$], on the crystals surface or in silanol nests. On the contrary, W-MFI-1 zeolite material [FIG. 4(A)-(b)] exhibits only well-resolved $Q_4$ signals, similar to F-MFI-B zeolite material, albeit slightly broader. This implies lower local distortions in the immediate vicinity of the $Q_4$ silicon sites than on Si-MFI-A zeolite material. Furthermore, only a broad signal at −100 ppm is observed for W-MFI-1 zeolite material [FIG. 4(A)-(b)], accounting for about 1-2% of the total intensity and disappearing in the cross-polarization spectrum. More importantly, it is known that when silicon atoms linked to the $Q_4$ site are substituted by heteroatoms, a downfield shift is observed; for instance, in the case of $Q_4(OZn)$, it is known that a signal appears around −95 ppm. Thus, a possible assignment for the −100 ppm peak in W-MFI-1 zeolite material is a $Q_4(OW)$ site. The slight distortion introduced by the incorporation of W in the MFI framework can explain the broadening of the $^{29}Si$ RMN line in the W-MFI-1 zeolite material compared to the F-MFI-B zeolite material [FIGS. 4(A)-(b) and 4(A)-(c)]. Such an assignment is further supported by cross-polarization {$^1H$}$^{29}Si$—CP MAS NMR spectra of nanosized zeolites W-MFI-1 and Si-MFI-A [FIGS. 4(B)-(b) and 4(B)-(a)]: while no signal is detected in the F-MFI-B zeolite material spectrum [FIG. 4(B)-(c)], the Si-MFI-A zeolite material exhibits strong Q and even $Q_2$ units [$(HO)_2Si(OSi)_2$] [FIG. 4(B)-(a)]. The formation of defect-free W-MFI-1 zeolite material is confirmed by the absence of any $Q_3$ and $Q_2$ signals in the {$^1H$}$^{29}Si$—CP MAS NMR spectrum [FIG. 4(B)-(b)], indicating no short-range defects, as in the F-MFI-B zeolite material [FIG. 4(B)-(c)].

Moreover, $^{29}Si$ NMR spectra were recorded on as-synthesized (i.e. after step 4)) and calcined samples (i.e. after step 5)) to verify whether existing defects in W-MFI-1 zeolite material are healed during calcination or are already absent at the synthesis stage. As shown in FIG. 5, the spectra of the as-synthesized (FIG. 5-$b_1$) and calcined (FIG. 5-$b_2$) W-MFI-1 zeolite material contain well-resolved resonances, highlighting that no defects are present after the synthesis. By comparison, the spectra of the as-synthesized (FIG. 5-$a_1$) and calcined (FIG. 5-$a_2$) Si-MFI-A zeolite material show strong $Q_3$ and even $Q_2$ units [$(HO)_2Si(OSi)_2$] like in FIG. 4(B)-(a).

1.4.3 HR-TEM Analyses

High-resolution transmission electron microscopy (HR-TEM) of W-MFI-1 zeolite material [FIGS. 6-(a) and 6-(b)] revealed the presence of nanocrystals with a size around 60-70 nm.

High-resolution transmission electron microscopy (HR-TEM) of Si-MFI-A zeolite material [FIGS. 6-(c) and 6-(d)] revealed the presence of nanocrystals with a size around 100 nm.

These results are consistent with the data obtained from SEM and Dynamic light scattering (DLS) (FIG. 7). FIG. 7(A) represents a FE-SEM image of Si-MFI-A zeolite material and FIG. 7(B) represents a FE-SEM image of W-MFI-1 zeolite material. FIG. 7(C) represents DLS curves of Si-MFI-A zeolite material (FIG. 7(C)-(a)) and W-MFI-1 zeolite material (FIG. 7(C)-(b)).

Indeed, the introduction of WI' in the W-MFI zeolite crystals cures structural framework defects and removes silanol groups from the surface by forming double bonds with oxygen, thus eliminating the need to terminate the crystals with silanols.

EDX-HR-TEM analyses of W-MFI-1 zeolite material and Si-MFI-A zeolite material indicated the presence of W in the former sample (FIG. 8). A peak at 8.4 keV corresponding to tungsten (1% by mass approximately) was clearly seen in the EDX spectrum, in agreement with ICP analyses.

In conclusion, nanosized defect-free tungsten containing MFI zeolite single nanocrystals were obtained with the method of some embodiments. Indeed, Tungsten acts as a defect-suppressing element due to its flexible coordination state; the defect sites (internal and external silanols) in the MFI zeolite nanocrystals can be saturated with $W^{VI}$ coordinated with 4 or 2 Si (T-atoms) via oxygen bridges, thus preventing the formation of silanols.

Example 2

Preparation of a Defect-free MFI-type Synthetic Zeolite Material V-MFI-2 According to the Method of Some Embodiments A defect-free MFI-type synthetic zeolite material V-MFI-2 was prepared according to the same procedure described in example 1.1, except that 0.15 g of $NaVO_3$ was used instead of 0.45 g of sodium tungstate dihydrate.

The resulting clear aqueous suspension obtained after step 1) had the following molar composition:

$$VO_3:25SiO_2:3TPA_2O:0.5Na_2O:500H_2O \qquad (I).$$

After step 5), monodisperse single nanocrystals of synthetic zeolite material V-MFI-2 were obtained. They had a size of about 60 nm.

Example 3

Preparation of a Defect-free MFI-type Synthetic Zeolite Material Mo-MFI-3 According to the Method of Some Embodiments A defect-free MFI-type synthetic zeolite material Mo-MFI-3 was prepared according to the same procedure described in example 1.1, except that 0.39 g of $Na_2MoO_4.2H_2O$ was used instead of 0.45 g of sodium tungstate dihydrate.

The resulting clear aqueous suspension obtained after step 1) had the following molar composition:

$$MoO_3:25SiO_2:3TPA_2O:1Na_2O:500H_2O \qquad (I).$$

After step 5), monodisperse single nanocrystals of synthetic zeolite material Mo-MFI-3 were obtained. They had a size of about 70 nm.

Example 4

Preparation of a Defect-free MFI-type Synthetic Zeolite Material Zr-MFI-4 According to the Method of Some Embodiments A defect-free MFI-type synthetic zeolite material Zr-MFI-4 was prepared according to the same procedure described in example 1.1, except that 0.27 g of $Na_2ZrO_3$ was used instead of 0.45 g of sodium tungstate dihydrate.

The resulting clear aqueous suspension obtained after step 1) had the following molar composition:

$$ZrO_2:25SiO_2:3TPA_2O:1Na_2O:500H_2O \qquad (I).$$

After step 5), monodisperse single nanocrystals of synthetic zeolite material Zr-MFI-4 were obtained. They had a size of about 90 nm.

Example 5

Preparation of a Defect-free MFI-type Synthetic Zeolite Material Sn-MFI-5 According to the Method of Some Embodiments A defect-free MFI-type synthetic zeolite material Sn-MFI-5 was prepared according to the same procedure described in example 1.1, except that 0.48 g of $Na_2Sn_3.3H_2O$ was used instead of 0.45 g of sodium tungstate dihydrate.

The resulting clear aqueous suspension obtained after step 1) had the following molar composition:

$$SnO_2:25SiO_2:3TPA_2O:1Na_2O:500H_2O \qquad (I).$$

After step 5), monodisperse single nanocrystals of synthetic zeolite material Sn-MFI-5 were obtained. They had a size of about 50 nm.

Example 6

Characterization of Defect-free MFI-type Synthetic Zeolite Materials Prepared in Examples 1 to 5

The table 1 below represents the porosity properties of the defect-free synthetic zeolite materials W-MFI-1, V-MFI-2, Mo-MFI-3 and Zr-MFI-4 which are part of some embodiments, and by comparison the ones of Si-MFI-A which is not part of the presently disclosed subject matter. There data were obtained by $N_2$ sorption analysis.

TABLE 1

| Zeolite material | $S_{BET}$ ($m^2 \cdot g^{-1}$) | $S_{ext}$ ($m^2 \cdot g^{-1}$) | $V_{micro}$ ($cm^3 \cdot g^{-1}$) | $V_{total}$ ($cm^3 \cdot g^{-1}$) |
|---|---|---|---|---|
| W-MFI-1 | 345 | 106 | 0.17 | 0.70 |
| V-MFI-2 | 368 | 106 | 0.14 | 0.48 |
| Mo-MFI-3 | 323 | 110 | 0.11 | 0.38 |
| Zr-MFI-4 | 308 | 55 | 0.12 | 0.21 |
| Sl-MFI-A (*) | 517 | 128 | 0.19 | 0.65 |

(*) not part of the presently disclosed subject matter

FIG. 9(A) and FIG. 9(B) represent the XRD diffraction spectrum of the defect-free synthetic zeolite materials V-MFI-2, Zr-MFI-4, Mo-MFI-3 and Sn-MFI-5 respectively prepared in example 2 [FIG. 9(A)-(*a*) and FIG. 9(B)-(*a*)], example 4 [FIG. 9(A)-(*b*) and FIG. 9(B)-(*b*)], example 3 [FIG. 9(A)-(*c*) and FIG. 9(B)-(*c*)] and example 5 [FIG. 9(A)-(*d*) and FIG. 9(B)-(*d*)].

Figure 1:
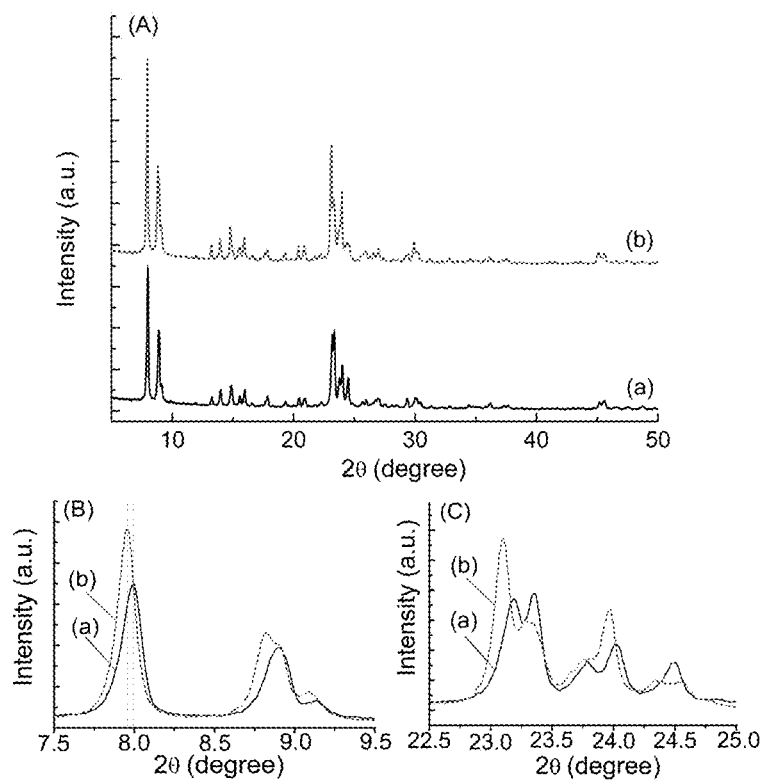
Figure 2:
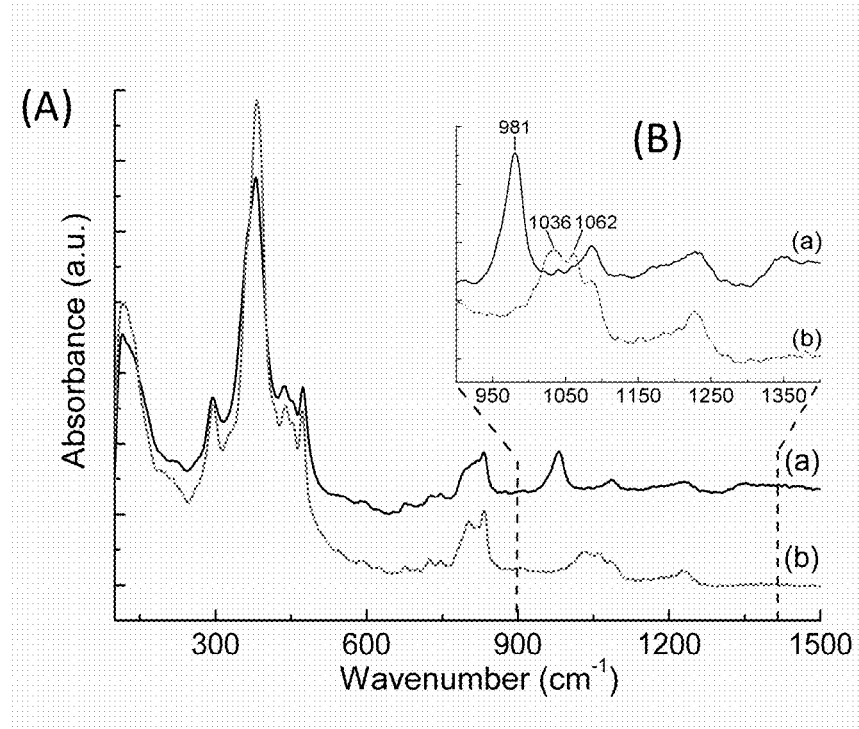
Figure 3:
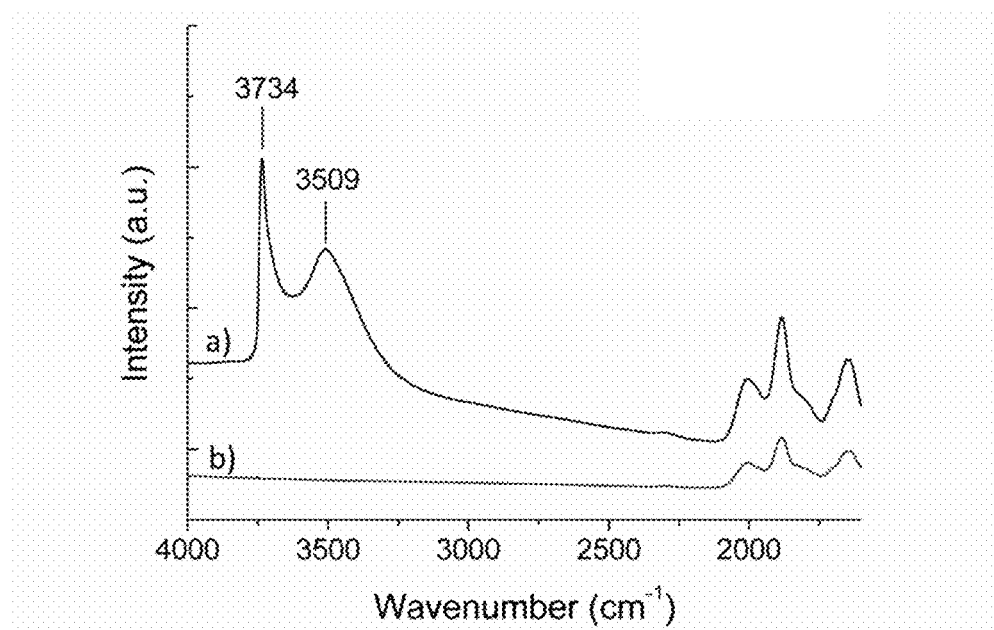
Figure 4:
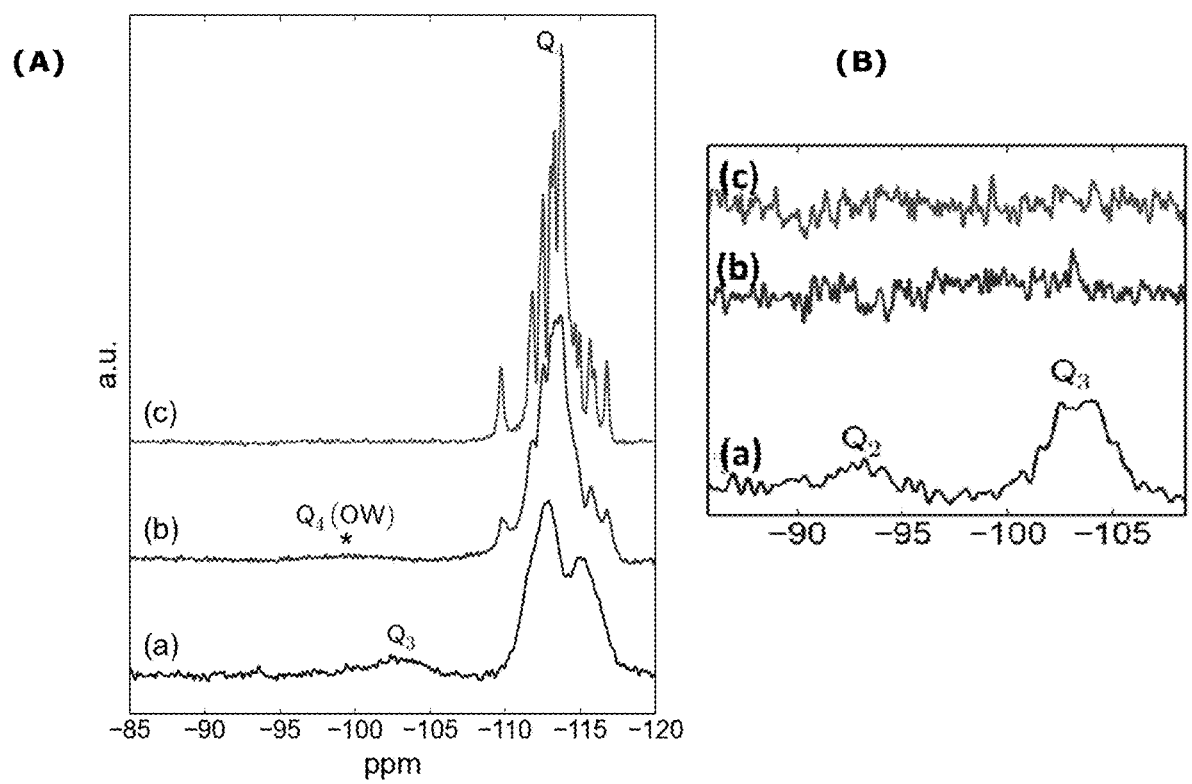
Figure 5:
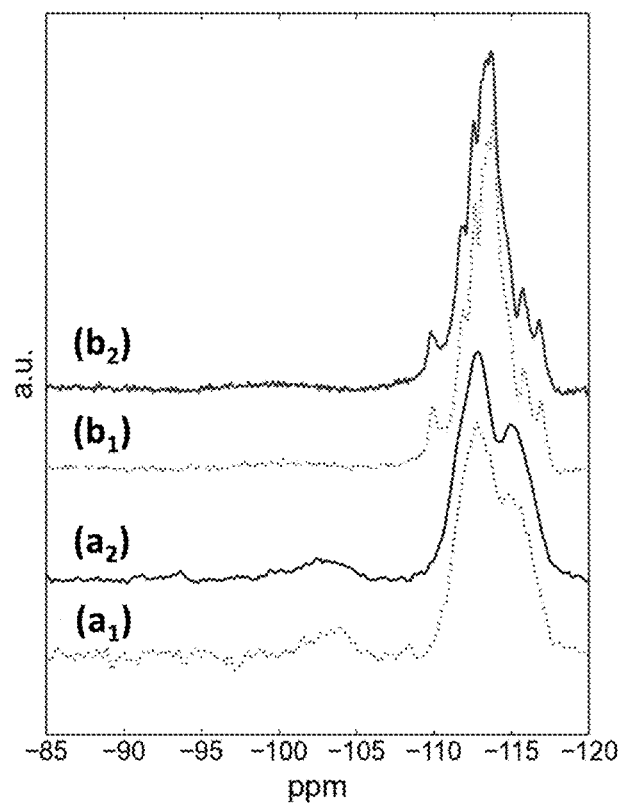
Figure 6:
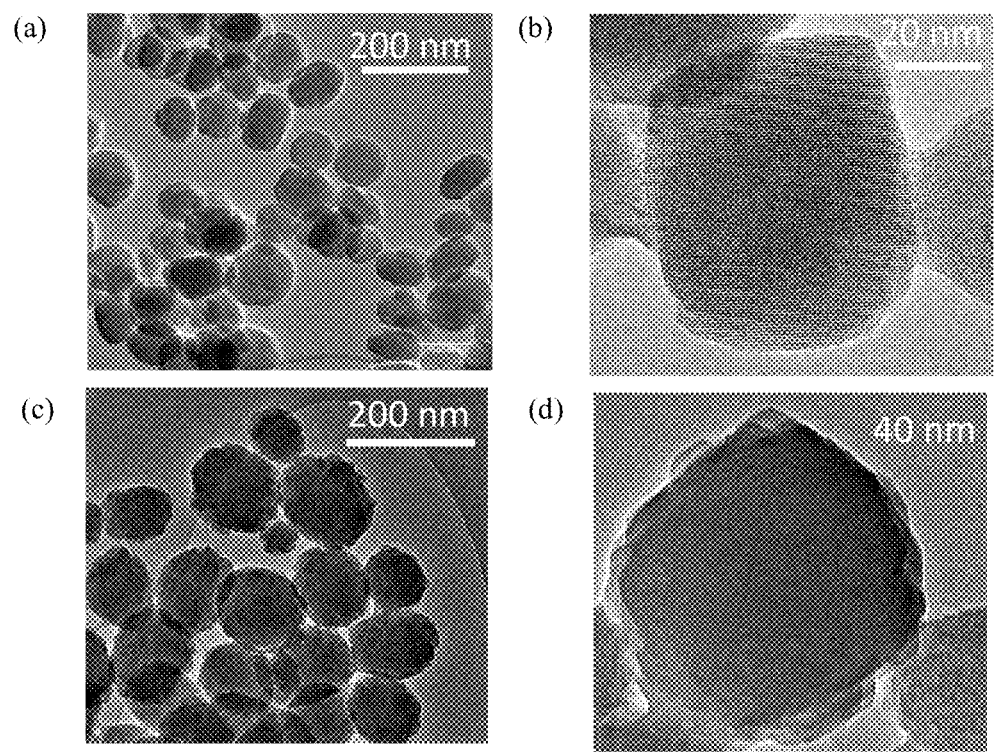
Figure 7:
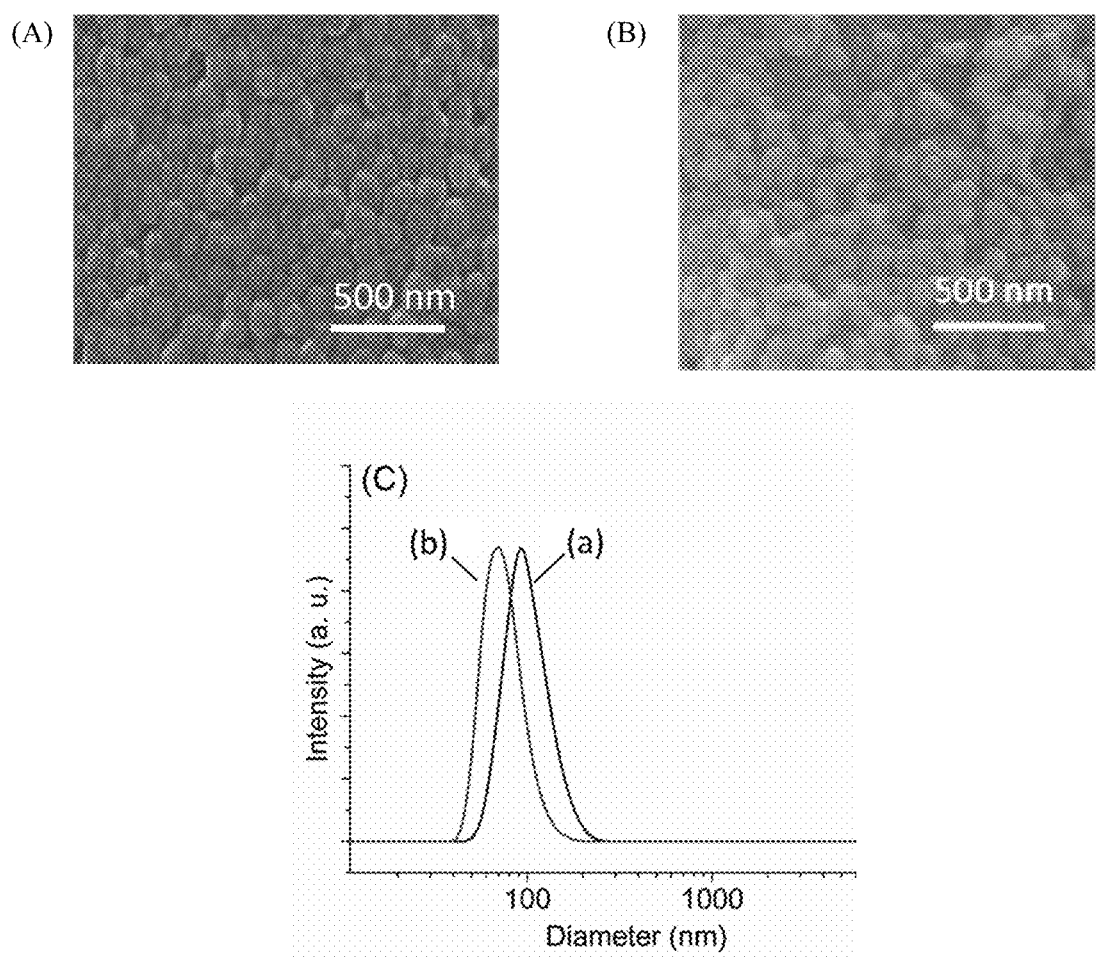
Figure 8:
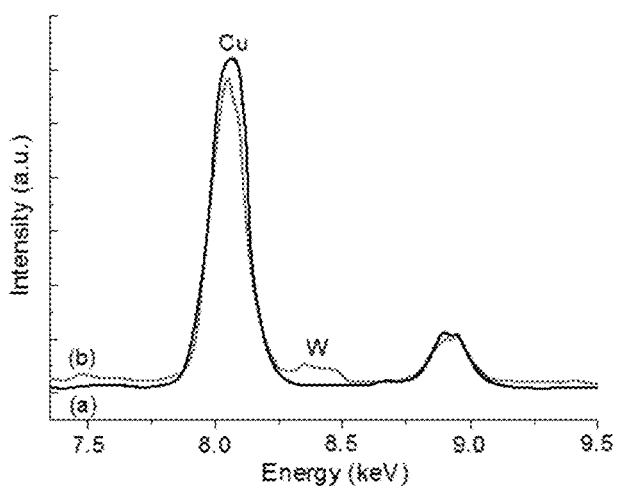
Figure 9:
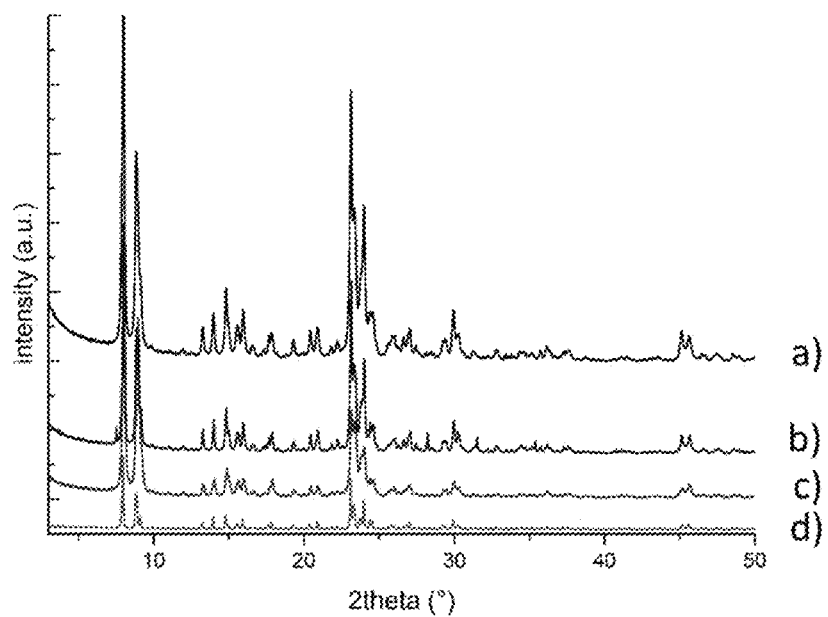
FIG. 9(A) shows the intensity (in arbitrary units: a.u.) as a function of the angle 2θ (in degree) in the range of 3-50 degrees and FIG. 9(B) in the range of 20-28 degrees.
Figure 9:
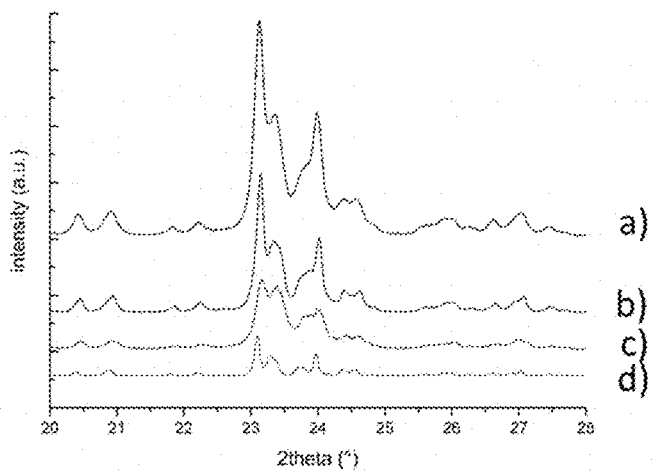
Figure 10:
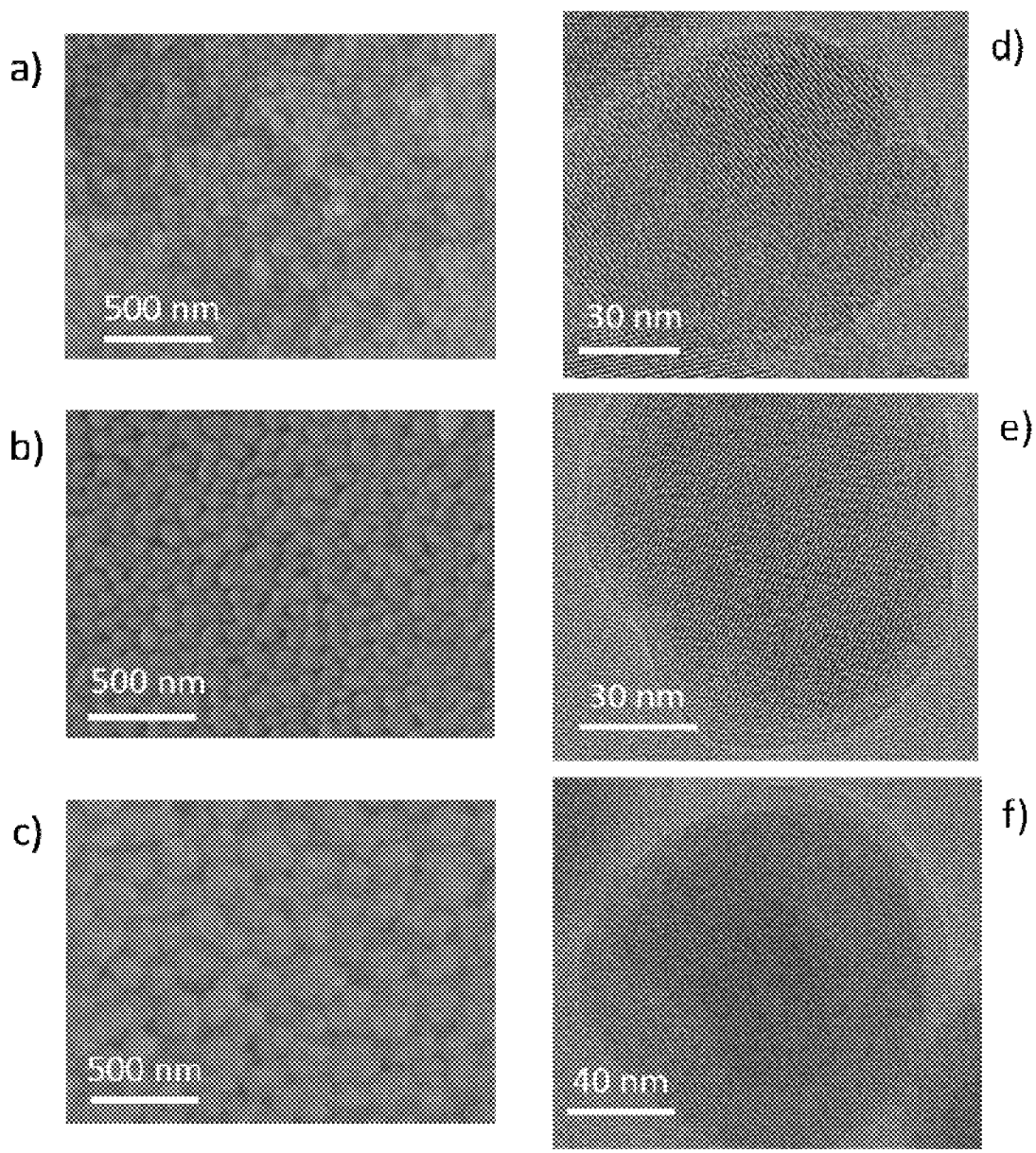
FIG. 10 represents SEM and TEM images of defect-free synthetic zeolite materials prepared in examples 2 to 4.

More particularly, FIGS. 10-(*a*) and FIG. 10-(*d*) respectively represent SEM and TEM images of defect-free V-MFI-2 zeolite material, FIG. 10-(*b*) and FIG. 10-(*e*) respectively represent SEM and TEM images of defect-free Mo-MFI-3 zeolite material, and FIG. 10-(*c*) and FIG. 10-(*f*) respectively represent SEM and TEM images of defect-free Zr-MFI-4 zeolite material.

Example 7

Use of the Defect-free MFI-type Synthetic Zeolite Material W-MFI-1 as an Adsorbent The detection of gases such as CO, $CO_2$, NO or $NO_2$ gases with defect-free W-MFI-1 zeolite material prepared in example 1.1 and for comparison with Si-MFI-A zeolite material prepared in example 1.2 was studied.

The zeolite materials were used as self-supported pellets and as thin films and the detection was followed using in situ FTIR spectroscopy.

For characterization of self-supported pellets (10 mg·$cm^{-2}$), the transmission IR spectra were recorded with a Nicolet Avatar spectrometer. A room temperature IR-cell equipped with a heating device offered the possibility to activate the samples at 525° C. prior to the measurements. The cell was connected to a high vacuum line with a reachable pressure of $10^{-5}$ Pa. Three-step activation was applied to the samples: a first step at 100° C. for 0.5 h to desorb most the adsorbed water, second and third steps at 200° C. and 525° C. for 0.5 h and 1.0 h, respectively to remove the residue (i.e. hydrocarbons) coming from the structure-directing agent. All above steps were performed under secondary vacuum. Little doses of gas have been incrementally introduced onto the MFI pellet present in FTIR cell at room temperature. All IR spectra were recorded at room temperature, and as a background the IR spectrum recorded in empty transmission cell under secondary vacuum at room temperature was used.

For characterization of films, a reactor-cell working in the temperature range 25-300° C. connected to operando IR system was used. The entire process, including activation of samples (removal of adsorbed water and contaminants at 300° C.) and controlled adsorption and desorption of pure $CO_2$, CO, $NO_2$ and NO as pure compounds in argon (Ar), were performed in the operando IR cell at room temperature. All experiments were performed in the presence of water with a concentration of 100 ppm coming from the Ar used as a carrier gas. The spectra were collected in a continuous mode (32 scans/spectrum) using a Bruker Tensor 27 spectrometer equipped with a DTGS detector.

Films Preparation:

Zeolite films were prepared by deposition of a coating suspension of the W-MFI-1 or Si-MFI-A zeolite material on a silicon wafer (spin coating method). The silicon wafers having a dimension of 10×10 mm² was first pre-cleaned with ethanol, and then placed in a WS-400B-6NPP-LITE spin coater system. The samples were vacuum-locked under nitrogen atmosphere during spinning process. In order to ensure the preparation of smooth and homogenous films, the coating suspensions of W-MFI-1 and Si-MFI-A zeolite nanocrystals were filtered (filters diameter of 200 nm) prior to deposition. In order to prepare films with good mechanical stability, firstly a solution of 5% by mass of polyvinylpyrrolidone (PVP) in ethanol was deposited on the wafer to form a smooth layer of polyvinylpyrrolidone (PVP)-based binder (spinning rate of 3000 rpm for 60 s). Then, after complete drying under air atmosphere, a zeolite coating suspension containing 1% by mass of W-MFI-1 zeolite nanocrystals or Si-MFI-A zeolite nanocrystals in ethanol solvent was deposited (500 rpm for 600 s). Finally, the obtained zeolite films were annealed at 550° C. for 6 h (heating rate of 3° C./min).

It is noted that the zeolite films can also be prepared by seed approach, dip coating, ink jet printing, drop casting or direct crystallization. Others organic or inorganic binders different from PVP can also be used and are described in Lakiss et al. [Thin Solid Films, 2010, 518, 2241-2246] and Mintova et al. [Nanoscale, 2013, 5, 6693-6703].

Figure 11:
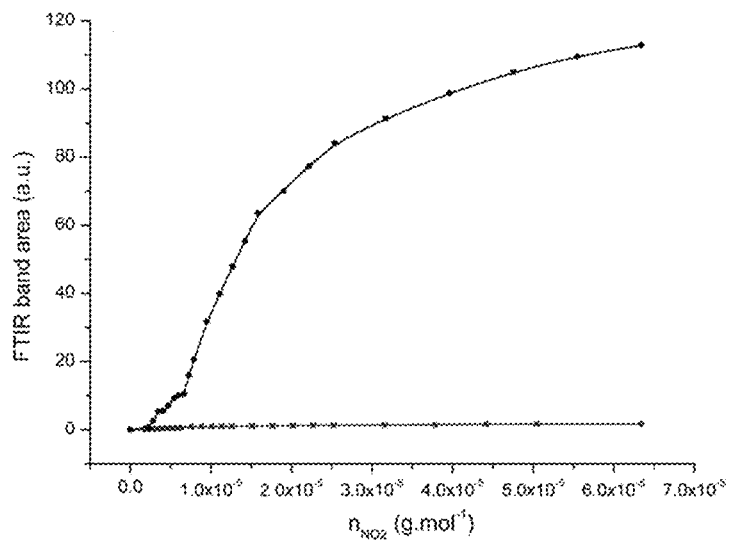
Figure 11:
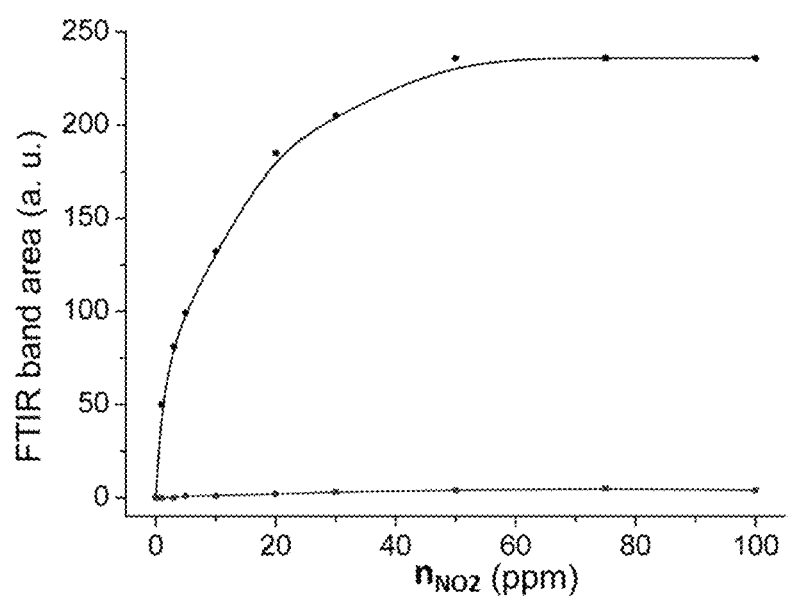

FIG. 11 represents the absorption capacity of W-MFI-1 zeolite material (curve with circles) and Si-MFI-A zeolite material (curve with squares) towards $NO_2$.

More particularly, FIG. 11(A) shows the FTIR band area (in arbitrary units, a.u.) of W-MFI-1 zeolite material (curve with circles) and Si-MFI-A zeolite material (curve with squares) assembled as self-supported pellets, as a function of the concentration of $NO_2$ (in g/mol, $n_{NO2}$) and FIG. 11(B) shows the FTIR band area (in arbitrary units, a.u.) of W-MFI-1 zeolite material (curve with circles) and Si-MFI-A zeolite material (curve with squares) assembled as thin films, as a function of the concentration of $NO_2$ (in ppm, $n_{NO2}$).

Figure 12:
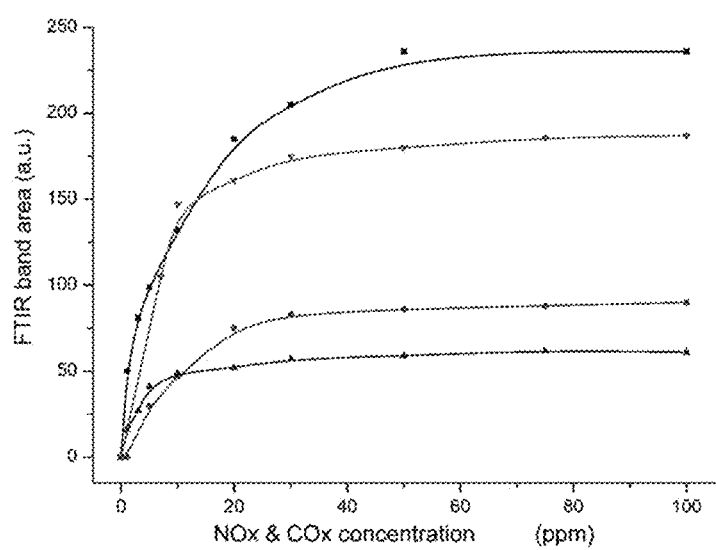

FIG. 12 represents the absorption capacity of the W-MFI-1 zeolite films towards $NO_2$ (curve with squares), NO (curve with circles), CO (curve with triangles) and $CO_2$ (curve with inversed triangles).

The invention claimed is:

1. A method for the preparation of a defect-free synthetic zeolite material in the form of monodisperse single nanocrystals having a size ranging from 10 to 400 nm, the defect-free synthetic zeolite material having a MFI-, BEA- or MEL- framework type and a silicon to metal M molar ratio Si/M ranging from 179 to 65440, the metal M being selected from W, V, Mo, Sn and Zr, the method comprising:

1) contacting at least one source of silicon, at least one source of alkali metal M' selected from Na and K, at least one source of metal M selected from W, V, Mo, Sn and Zr, at least one tetraalkylammonium hydroxide structure-directing agent and water, so as to obtain a clear aqueous suspension having the following molar composition:

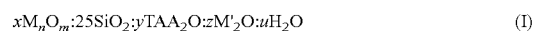

$$xM_nO_m:25SiO_2:yTAA_2O:zM'_2O:uH_2O \quad (I)$$

in which:
0.01≤x≤1.5,
2≤y≤9,
0.01≤z≤4,
300≤u≤3000,
n is an integer equal to 1 or 2, and
m is an integer and 2≤m≤5;

2) aging the resulting clear suspension of step 1) at a temperature ranging from 20° C. to 30° C.;
3) heating the resulting clear suspension at a temperature ranging from 40° C. to 180° C. so as to form a dispersion of a solid comprising monodisperse single nanocrystals of the synthetic zeolite material in a liquid;
4) separating and recovering the solid from the liquid; and
5) calcining the solid so as to obtain the synthetic zeolite material in the form of monodisperse single nanocrystals.

2. The method according to claim 1, wherein the source of silicon is selected from silica hydrogel, silicic acid, colloidal silica, fumed silica, tetraalkyl orthosilicates, silica hydroxides, precipitated silica and sodium silicates.

3. The method according to claim 1, wherein the source of alkali metal M' is selected from a source of Na and a source of K.

4. The method according to claim 1, wherein the source of M and M' is a sodium or a potassium salt of the metal M.

5. The Method according to claim 4, wherein the source of M and M' is $Na_2WO_4.2H_2O$, $K_2WO_4$, $NaVO_3$, $KVO_3$, $Na_2MoO_4.2H_2O$, $K_2MoO_4$, $Na_2SnO_3.3H_2O$, $K_2SnO_3.3H_2O$, $Na_2ZrO_3$ or $K_2ZrO_3$.

6. The Method according to claim 1, wherein the tetraalkylammonium hydroxide structure-directing agent is tetraethylammonium hydroxide, tetrabutylammonium hydroxide or tetrapropylammonium hydroxide.

7. The Method according to claim 1, wherein step 1) is performed at a temperature ranging from 0° C. to 30° C.

8. The Method according to claim 1, wherein the clear aqueous suspension of molar composition (I) has a pH ranging from 12 to 14.

9. The Method according to claim 1, wherein step 1) is performed according to the following sub-steps:

1-a) separately preparing a clear aqueous silicate suspension A including at least one source of silicon, at least one tetraalkylammonium hydroxide structure-directing agent and water, and a clear aqueous suspension B including at least one source of alkali metal M' selected from Na and K, at least one source of metal M selected from W, V, Mo, Sn and Zr, and water, and 1-b) admixing the clear aqueous silicate suspension A and the clear aqueous suspension B until a clear aqueous suspension having the molar composition (I) is obtained.

10. The method according to claim 9, wherein in the admixing sub-step 1-b), the clear aqueous suspension B is added drop wise to the clear aqueous silicate suspension A.

11. The Method according to claim 1, wherein the aging step 2) is carried out by stirring the clear aqueous suspension of step 1).

12. The Method according to claim 1, wherein the separation and recovering step 4) is performed by filtration, by centrifugation, by dialysis or by using flocculating agents followed by filtration.

13. The Method according to claim 1, wherein step 5) is carried out at a temperature ranging from 400° C. to 800° C. under an air, oxygen or inert atmosphere.

14. The Method according to claim 1, further comprising, between steps 4) and 5), a step i) of storing the solid obtained in step 4).

15. A defect-free synthetic zeolite material prepared according the method as defined in claim 1, wherein:
the material is in the form of monodisperse single nanocrystals having a size ranging from 10 to 400 nm,
the material has a MFI-, BEA- or MEL- framework type, and
the material has a silicon to metal M molar ratio Si/M ranging from 179 to 65440, the metal M being selected from W, V, Mo, Sn and Zr.

16. The defect-free synthetic zeolite material according to claim 15, further comprising at most 1% by mass of metal M, with respect to the total mass of the defect-free synthetic zeolite material.

17. A stable colloidal suspension of a defect-free synthetic zeolite material in the form of monodisperse single nanocrystals having a size ranging from 10 to 400 nm, the defect-free synthetic zeolite material having a MFI-, BEA- or MEL- framework type and a silicon to metal M molar ratio Si/M ranging from 179 to 65440, the metal M being selected from W, V, Mo, Sn and Zr, the material comprising:
at least one solvent, and
the defect free synthetic zeolite material as defined in claim 15.

18. The stable colloidal suspension according to claim 17, wherein the mass concentration of the defect-free synthetic zeolite material in the colloidal suspension ranges from 0.1 to 10% by mass, with respect to the total mass of the colloidal suspension.

19. The stable colloidal suspension according to claim 17, wherein the solvent is selected from water, acetone and alcohols.

* * * * *